(12) United States Patent
Ueda et al.

(10) Patent No.: US 7,465,968 B2
(45) Date of Patent: Dec. 16, 2008

(54) SEMICONDUCTOR DEVICE AND METHOD FOR FABRICATING THE SAME

(75) Inventors: Tetsuzo Ueda, Osaka (JP); Satoshi Nakazawa, Osaka (JP); Tatsuo Morita, Kyoto (JP)

(73) Assignee: Panasonic Corporation, Osaka (JP)

( * ) Notice: Subject to any disclaimer, the term of this patent is extended or adjusted under 35 U.S.C. 154(b) by 163 days.

(21) Appl. No.: 11/600,067

(22) Filed: Nov. 16, 2006

(65) Prior Publication Data
US 2007/0117355 A1 May 24, 2007

(30) Foreign Application Priority Data
Nov. 21, 2005 (JP) .............................. 2005-335504

(51) Int. Cl.
*H01L 29/737* (2006.01)
(52) U.S. Cl. .................... 257/194; 257/191; 257/192
(58) Field of Classification Search .......... 257/191–194
See application file for complete search history.

(56) References Cited

U.S. PATENT DOCUMENTS

| | | | |
|---|---|---|---|
| 5,869,364 A * | 2/1999 | Nakano et al. ............. 438/167 |
| 7,244,974 B2 * | 7/2007 | Saito et al. ................. 257/194 |
| 7,253,455 B2 * | 8/2007 | Green et al. ................ 257/194 |
| 7,413,958 B2 * | 8/2008 | Gunter et al. .............. 438/347 |
| 2003/0107065 A1 * | 6/2003 | Taniguchi et al. .......... 257/289 |
| 2005/0145883 A1 * | 7/2005 | Beach et al. ............... 257/194 |
| 2005/0274980 A1 * | 12/2005 | Miyoshi .................... 257/192 |

OTHER PUBLICATIONS

Hikita et al., "350V/150A AlGaN/GaN power HFET on Silicon substrate with source-via grounding (SVG) structure", IEDM Tech. Digest, 2004, p. 803, IEEE.
Camarchia, et al., "Physics-Based Modeling of Submicron GaN Permeable Base Transistors", IEEE Electron Device Letters, Jun. 2002, pp. 303-305, vol. 23, No. 6, IEEE.

* cited by examiner

*Primary Examiner*—Kevin M Picardat
*Assistant Examiner*—Bac H Au
(74) *Attorney, Agent, or Firm*—McDermott Will & Emery LLP

(57) ABSTRACT

A semiconductor device includes: a first nitride semiconductor layer having at least one projection on an upper surface thereof; a second nitride semiconductor layer formed on a top surface of the projection of the first nitride semiconductor layer and having a higher carrier concentration than the first nitride semiconductor layer; a first electrode formed on the second nitride semiconductor layer so as to overhang like a canopy and functioning as one of a source and a drain; and a second electrode formed to the side of the projection on the first nitride semiconductor layer and functioning as a gate.

16 Claims, 8 Drawing Sheets

The pulse width of $V_{ds}$ :80μs
The duty :1%

SEMICONDUCTOR DEVICE AND METHOD FOR FABRICATING THE SAME

CROSS-REFERENCE TO RELATED APPLICATION

The disclosure of Japanese Patent Application No. 2005-335504 filed on Nov. 21, 2005 including specification, drawings and claims is incorporated herein by reference in its entirety.

BACKGROUND OF THE INVENTION

The present invention relates to semiconductor devices, which use nitride semiconductors and are applicable to high-power transistors for use in power supply circuits in consumer appliances, and methods for fabricating those semiconductor devices.

The Group III nitride semiconductors, typified by gallium nitride (GaN), have high breakdown electric field; the band gaps of gallium nitride (GaN) and aluminum nitride (AlN) are as high as 3.4 eV and 6.2 eV, respectively, at room temperature. In addition, the Group III nitride semiconductors have the advantage that electron saturation drift velocity is higher as compared with compound semiconductors, such as gallium arsenide, and semiconductors made of silicon (Si). The Group III nitride semiconductors are thus under vigorous research and development for application to high-voltage high-power switching elements.

Furthermore, it has been reported that two-dimensional electron gas having a sheet carrier concentration of $1 \times 10^{13}$ $cm^{-2}$ or higher is generated at the heterointerface in a heterostructure of AlGaN and GaN, in which the plane orientation of the interface is (0001), by spontaneous polarization and piezo polarization occurring perpendicularly with respect to the interface even when the heterostructure is not doped, and that a so-called normally-on heterojunction field effect transistor having low on-resistance can be formed by utilizing that two-dimensional electron gas (see, for example, p 803 in IEDM Tech. Digest 2004 by M. Hikita et al.). In order to increase the breakdown voltage of such a planar transistor, the distance between the gate electrode and the drain electrode must be increased. For example, in the above-described GaN-based transistor, a breakdown voltage of 350 V is achieved by increasing the distance between the gate electrode and the drain electrode to about 10 μm.

To reduce the electric field in the end portion of the gate electrode for further increase in breakdown voltage, it is also effective to employ a field plate structure, in which a source electrode is provided above a passivation film, and the like.

However, in realizing a high-voltage device by such a conventional planar transistor, there are problems in that the chip size is increased and the fabrication process becomes complicated.

On the other hand, as a device structure that enables higher breakdown voltage with smaller chip area, there are transistors having a vertical structure, called a PBT (permeable base transistor) or an SIT (static induction transistor). Such vertical transistors typically have a structure, in which a projection is formed on a semiconductor layer with a source electrode and a drain electrode formed on the top and back sides of the projection, a gate electrode is then formed on the side faces of the projection, and the channel current is controlled by gate voltage applied to the gate electrode. For an example in which this vertical transistor structure was applied to nitride semiconductors, suggestions of structure and device simulation results have been reported (see, for example, V. Camarchia et al. IEEE Electron Device Letters 23 (2002)303).

The device structure described in the second literature is as follows.

A first $n^+$-type GaN layer is formed on a drain electrode, and an $n^-$-type GaN layer having a projection and a second $n^+$-type GaN layer are formed over the first $n^+$-type GaN layer. A gate electrode is formed in the lower portion and on the side faces of the projection so as to be in contact with the $n^-$-type GaN layer, while a source electrode is formed on the top surface of the projection. Current passing across the source and drain electrodes can be controlled by application of negative voltage to the gate electrode, thereby allowing realization of a field effect transistor. In this vertical device, the drain breakdown voltage can be increased by increasing the thickness of the part of the $n^-$-type GaN layer located under the gate electrode and by lowering the carrier concentration in the $n^-$-type GaN layer, whereby high breakdown voltage can be achieved with the chip area kept small.

Nevertheless, for the nitride semiconductor field effect transistor having the conventional vertical structure, the second literature does not describe a specific method for forming the gate electrode in such a manner that the gate electrode is in contact with the side faces of the projection, and it is very difficult to actually form the gate electrode on the side faces of the projection.

A possible conventional fabrication method is to selectively form the gate electrode to the side of the projection by using a mask pattern, after the source electrode is formed, for example. However, with consideration given also to the mask alignment accuracy, the gate electrode can only be formed about 0.2 μm away from the side faces, for example, such that the drain electrode cannot be sufficiently controlled by the gate voltage. Therefore, excellent pinch-off operation cannot be realized, and it also becomes difficult to achieve normally-on operation that is strongly required for a high-voltage power element.

As described above, there is a problem in that it is difficult to realize a practical vertical nitride semiconductor device having small chip area.

In view of the above problem, it is therefore an object of the present invention to realize a semiconductor device made of nitride semiconductors and having small chip area and excellent device characteristics.

SUMMARY OF THE INVENTION

In order to achieve the object, according to the present invention, a semiconductor device has a structure in which by using as a mask a first electrode selectively formed on part of a nitride semiconductor layer, a projection is formed on part of a nitride semiconductor layer located under the first electrode with the first electrode overhanging the projection like a canopy and a second electrode is formed around the projection in a self-aligned manner.

In this structure, if the second electrode is used as a gate electrode, the controllability of the drain current by the gate voltage is improved, which allows realization of a vertical semiconductor device made of nitride semiconductors and having excellent pinch-off characteristics.

More specifically, an inventive semiconductor device includes: a first nitride semiconductor layer having at least one projection on an upper surface thereof; a second nitride semiconductor layer formed on a top surface of the projection of the first nitride semiconductor layer and having a higher carrier concentration than the first nitride semiconductor layer; a first electrode formed on the second nitride semiconductor layer so as to overhang like a canopy and functioning as one of a source and a drain; and a second electrode formed to the side of the projection on the first nitride semiconductor layer and functioning as a gate.

In the inventive semiconductor device, the second electrode as the gate can be formed in a self-aligned manner by using the first electrode serving as the source or the drain. This enables a vertical-channel field effect transistor with smaller chip area to be realized. Also, when the first electrode is used as the source, the upper surface of the first nitride semiconductor layer except for the projection is not exposed. It is thus possible to suppress a so-called current collapse phenomenon, in which the drain current decreases after application of high voltage, whereby a highly reliable semiconductor device is obtainable.

In the inventive semiconductor device, a conductive film made of the same material as the second electrode is preferably formed on the first electrode.

The second nitride semiconductor layer is preferably made of a quaternary mixed crystal of InAlGaN. Then, the quaternary mixed crystal, which has a low potential barrier with respect to a metal electrode, can achieve a low ohmic contact resistance with respect to the first electrode. As a result, a semiconductor device having lower series resistance is achieved.

In this case, the quaternary mixed crystal preferably has a composition that allows the quaternary mixed crystal to achieve lattice matching with the first nitride semiconductor layer. Then, the second nitride semiconductor layer made of InAlGaN has excellent crystallinity and can also be easily formed as a thick film, thereby achieving lower resistance.

Also, in this case, an amount of polarization occurring in the quaternary mixed crystal is preferably greater than or equal to an amount of polarization occurring in the first nitride semiconductor layer. Then, it is possible to obtain a semiconductor device having lower series resistance without increasing a potential barrier due to a polarization electric field between the first and second nitride semiconductor layers.

In the inventive semiconductor device, a high-resistance region is preferably formed in part of the first nitride semiconductor layer located under the second electrode. Then, it becomes possible to control the thickness of a depletion layer by voltage applied to the second electrode only in a so-called channel region in which current flows, whereby a semiconductor device having excellent pinch-off characteristics is realized.

In this case, the high-resistance region is preferably formed in an entire part of the first nitride semiconductor layer located under a peripheral portion of the second electrode. Then, when the first electrode is used as the source, the breakdown voltage between the drain electrode and the second electrode is not determined by the strength of the electric field around the second electrode, but only by the thickness of, and the carrier concentration in, the first nitride semiconductor layer, thereby enabling higher breakdown voltage.

In the inventive semiconductor device, a high-resistance region is preferably formed in part of the first nitride semiconductor layer below the first electrode. Then, in the region below the first electrode, a so-called pad region, below which current is not controlled by variation in the gate voltage, has a high resistance, whereby a semiconductor device having more excellent pinch-off characteristics is realized.

Also, in the inventive semiconductor device, part of the second nitride semiconductor layer below the first electrode is preferably selectively removed. Then, the second nitride semiconductor layer having lower resistance is removed below the so-called pad region located below the first electrode, while, in the pad region, the first electrode is in contact with the first nitride semiconductor layer having higher resistance. Therefore, no current passes below the pad region, whereby a semiconductor device having excellent pinch-off characteristics is achieved.

The inventive semiconductor device preferably further includes an insulating film formed in a region between the first electrode and the second nitride semiconductor layer. Then, since the insulating film is formed below the so-called pad region located below the first electrode, no current passes below the pad region, whereby a semiconductor device having excellent pinch-off characteristics is achieved.

In the inventive semiconductor device, each side of a perimeter of the first electrode is preferably a line segment in a <1-100> or <11-20> direction of a zone axis of the second nitride semiconductor layer. Then, when the side faces of the projection are etched, the etching can be performed isotropically on the first and second nitride semiconductor layers. Therefore, when the second electrode is formed in a self-aligned manner, the first and second electrodes are not electrically connected, whereby a semiconductor device, in which leakage current is small, is realized with higher reproducibility.

It should be noted that the minus sign "−" added to the index numbers indicating the plane orientations and the zone axes in semiconductor crystals herein means the inversion of the negative index numbers following the minus sign for the sake of convenience.

In the inventive semiconductor device, part of the first electrode is preferably made of tungsten silicide (WSi). For example, in a case in which the second nitride semiconductor layer is formed of a quaternary mixed crystal of InAlGaN, the contact resistance of the first electrode can be made sufficiently small. In addition, since WSi has high heat resistance and thus can be subjected to heat treatment after the formation of the first electrode, a highly reliable semiconductor device having lower series resistance is achievable.

In the inventive semiconductor device, a region around the first electrode is preferably filled with a resin material made of benzocyclobutene (BCB). Then, since the region around the projection is filled with the BCB film whose dielectric constant is as small as 2.5, the parasitic capacitance is reduced, thereby enabling realization of a semiconductor device having excellent high-frequency characteristics.

In the inventive semiconductor device, surfaces of the first and second nitride semiconductor layers are preferably non-polarized surfaces in which the number of nitrogen atoms and the number of group III metal atoms are equal to each other. Then, since an electric field due to polarization does not occur in the current flow direction, an electron accumulation layer and a depletion layer, for example, are not created even in cases where polarization in the first nitride semiconductor layer is different from that in the second nitride semiconductor layer, for example. As a result, a semiconductor device having low series resistance is obtainable.

In the inventive semiconductor device, surfaces of the first and second nitride semiconductor layers are preferably nitrogen surfaces containing only nitrogen atoms, and the plane orientation thereof is preferably (000-1). Then, a polarization electric field is created in the direction in which electrons injected from the first electrode are accelerated, for example, whereby a semiconductor device having high transconductance or low series resistance is realized.

The inventive semiconductor device preferably further includes a conductive substrate made of gallium nitride and functioning as an underlying layer for the first nitride semiconductor layer; and a third electrode formed on a surface of the conductive substrate away from the first nitride semiconductor layer and functioning as the other of the source and the drain. Then, the third electrode does not have to be formed on the side of the substrate on which the first electrode is formed, thereby enabling the chip area to be reduced further. In addition, since the third electrode is formed on the surface of the substrate away from the first electrode, a semiconductor device having lower series resistance is achievable.

An inventive method for fabricating a semiconductor device includes the steps of: (a) forming a first nitride semiconductor layer and a second nitride semiconductor layer in this order over a substrate, the second nitride semiconductor layer having a higher carrier concentration than the first nitride semiconductor layer; (b) selectively forming, on the second nitride semiconductor layer, a first electrode functioning as a source or a drain; (c) with the first electrode used as a mask, selectively etching the second nitride semiconductor layer and an upper portion of the first nitride semiconductor layer in such a manner that the first electrode, like a canopy, overhangs the second nitride semiconductor layer and the upper portion of the first nitride semiconductor layer; and (d) with the canopy-like overhanging first electrode used as a mask, forming a second electrode, as a gate, on the first nitride semiconductor layer in a self-aligned manner.

According to the inventive semiconductor device fabrication method, the second electrode can be formed in a self-aligned manner by using the first electrode, thereby enabling the chip area to be reduced. In addition, when the first electrode is used as the source, the upper surface of the first nitride semiconductor layer except for the projection is not exposed. It is thus possible to suppress a so-called current collapse phenomenon, in which the drain current decreases after application of high voltage, whereby a highly reliable semiconductor device is obtainable.

In the inventive method, in the step (c), wet etching is preferably used at least in part of the etching of the first and second nitride semiconductor layers. Then, the first and second nitride semiconductor layers can be etched isotropically, such that the reproducibility in the process step of forming the first electrode in the shape of a canopy is increased. As a result, a semiconductor device having small chip area can be obtained with a high yield.

In the inventive method, at least part of the second nitride semiconductor layer that is in contact with the first electrode is preferably made of a quaternary mixed crystal of InAlGaN.

The inventive method preferably further includes the steps of: (e) after the step (d), filling a region on the first nitride semiconductor layer around the first electrode with a resin film made of benzocyclobutene (BCB); and (f) forming, on the resin film, an interconnect electrically connected with the first or second electrode. Then, in the region around the first electrode, the parasitic capacitance is reduced by the BCB film whose dielectric constant is as small as 2.5, thereby enabling realization of a vertical semiconductor device having excellent high-frequency characteristics.

DETAILED DESCRIPTION OF THE INVENTION

First Embodiment

Hereinafter, a first embodiment of the present invention will be described with reference to the accompanying drawings.

Figure 1:
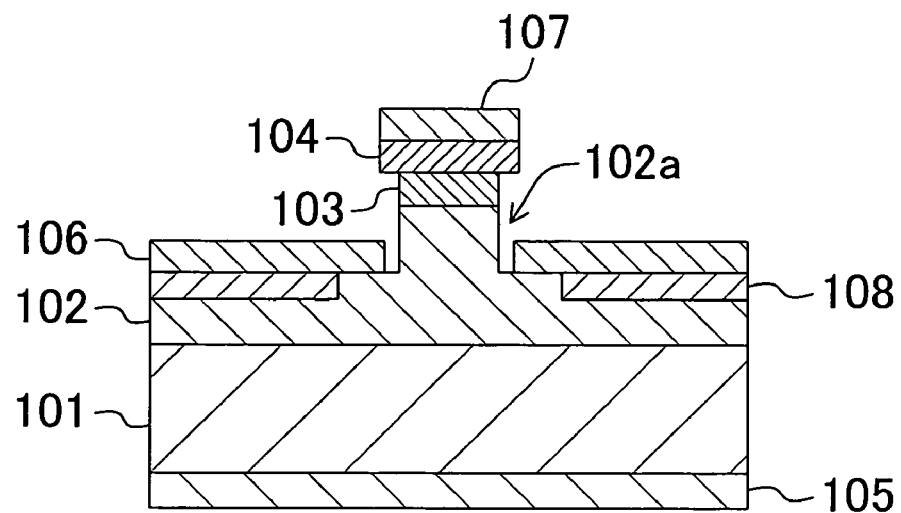
FIG. 1 is a cross-sectional view illustrating a semiconductor device, which is a vertical-channel field effect transistor, according to a first embodiment of the present invention.

FIG. 1 illustrates a cross sectional structure of a semiconductor device, which is a vertical-channel field effect transistor, according to the first embodiment of the present invention.

As shown in FIG. 1, the field effect transistor according to the first embodiment includes an active layer 102, an n-type contact layer 103, a source electrode 104, a gate electrode 106, and a drain electrode 105, for example. The active layer 102 is formed on the principal surface of an $n^+$-type GaN substrate 101, whose plane orientation is (0001), has a thickness of about 1.7 μm, has a projection 102a on the upper portion thereof, and is made of $n^-$-type GaN. The n-type contact layer 103 is formed on the top surface of the projection 102a of the active layer 102, has a thickness of 20 nm, and is made of n-type InAlGaN. The source electrode 104, made of tungsten silicide (WSi) and being ohmic, is formed on the n-type contact layer 103 so as to overhang like a canopy. The gate electrode 106 made of palladium silicide (PdSi) is formed to the side of the projection 102a of the active layer 102. The drain electrode 105 is formed on the surface of the substrate 101 away from the active layer 102, is made of titanium (Ti) and aluminum (Al) stacked in this order, and is ohmic. As a dopant for the n-type nitride semiconductors, such as $n^+$-type GaN, silicon (Si) may be used, for example.

A conductive film 107 made of the PdSi of the gate electrode 106 is formed on the source electrode 104.

As described above, the field effect transistor according to the first embodiment is a vertical device having a vertical channel, in which the gate electrode 106 is formed in a self-aligned manner by using, as a mask, the source electrode 104 formed over the projection 102a of the active layer 102 so as to overhang like a canopy.

In this embodiment, the projection 102a is formed by etching the n-type contact layer 103 and the upper portion of the active layer 102 to a total depth of about 300 nm.

The n-type contact layer 103 made of InAlGaN has a low barrier height with respect to metal, and thus achieves a contact resistance of about $1 \times 10^{-5} \Omega cm^2$ even in a case where the source electrode is made of non-heat treated WSi, for example.

The InAlGaN of the n-type contact layer 103, which is quaternary mixed crystal, is $In_{0.09}Al_{0.39}Ga_{0.52}N$, for example, and may have any composition that allows the n-type contact layer 103 to have excellent crystallinity and to be a thick film for lattice matching with the GaN of the active layer 102. Moreover, as stated previously, the source electrode 104 formed on the n-type contact layer 103 overhangs from the side faces of the projection 102a like a canopy, and the gate electrode is formed by a so-called self-aligned process with the source electrode 104 used as a mask.

In an upper portion in the active layer 102 located under the gate electrode 106, a high-resistance region 108 is formed by ion implantation of, e.g., boron (B) ions or oxygen (O) ions, by selective oxidation, or the like.

In the first embodiment, if the width of the projection 102a shown in FIG. 1 is 0.6 μm and the carrier concentration of the active layer 102 is $1 \times 10^{17}$ cm$^{-3}$, for example, the threshold voltage of the field effect transistor becomes close to 0 V, allowing so-called normally-off operation to be realized. Also, if the source electrode 104 formed over the projection 102a has a width of about 0.8 μm, the source electrode 104 has a sufficiently large canopy-like shape.

In general, in order to achieve a higher positive threshold voltage in a field effect transistor, and then to operate the field effect transistor while the gate voltage is being varied to a positive voltage with leakage current being small, it is desired that the value of a work function in the gate electrode formation material be large. For example, in addition to conductive material whose major constituent is Pd, transparent conductive material and the like made of ZnInSnO (ZITO), GaInSnO (GITO), or other oxide have a work function of about 6 eV, which is favorable in realizing the above-described normally-off operation.

Also, on the principal surface of the GaN substrate 101 shown in FIG. 1, which is a so-called Ga surface whose plane orientation is (0001), a polarization electric field is created in the direction going from the back surface toward the principal surface. This accelerates electrons injected from the source electrode 104, and is thus effective for the speeding up of the operation of the field effect transistor and for increase in the transconductance thereof.

At the heterointerface between the InAlGaN n-type contact layer 103 and the n$^-$-type GaN active layer 102, electrons are likely to accumulate when polarization occurring in the InAlGaN is larger than that occurring in the GaN, for example. This may cause deterioration in the device characteristics.

In contrast, in a case where a nitride semiconductor whose growth face is a so-called non-polarized a-plane (=(11-20) plane) is formed on a sapphire substrate whose principal surface has the plane orientation of an R-plane (=(1-102) plane), for example, a polarization electric field is not formed perpendicularly with respect to the heterointerface. This permits electrons to travel without being affected by the polarization electric field, whereby the speed of the operation of the field effect transistor can be enhanced.

To lower the contact resistance of the source electrode 104, the larger the amount of Si doping in the n-type contact layer 103 the better; for example, the n-type contact layer 103 is doped at $1 \times 10^{19}$ cm$^{-3}$ or higher.

The breakdown voltage of the field effect transistor in the off state, which is so-called the drain breakdown voltage, is determined by the carrier concentration in, and the thickness of, the active layer 102. For example, when the carrier concentration of the active layer 102 is $1 \times 10^{17}$ cm$^{-3}$ and the thickness thereof is 2 μm, the field effect transistor can realize a breakdown voltage of about 300 V. Also, in order for the field effect transistor to achieve a lower threshold voltage and a higher breakdown voltage, it is desired that residual carrier concentration in the active layer 102 be as small as possible. Therefore, for example, the active layer 102 may be undoped, or alternatively, the active layer 102 may be doped with magnesium (Mg), zinc (Zn), iron (Fe) or the like, so as to achieve higher resistance.

Moreover, although the n$^+$-type GaN conductive substrate 101 is used in the first embodiment, other substrate may be used; for example, sapphire, silicon carbide (SiC), or silicon (Si) may be used. In the case in which an insulating substrate, such as a sapphire substrate, is used as the substrate 101, the following process steps may be performed: a second n-type contact layer made of n$^+$-type GaN is formed between the insulating substrate and the active layer 102, and thereafter, part of the n-type contact layer 103 and part of the active layer 102 formed on the second n-type contact layer are selectively removed so as to expose part of the second n-type contact layer, where a drain electrode is then formed.

As described above, the vertical field effect transistor according to the first embodiment realizes a high voltage device having small chip area by employing the vertical device structure. In addition, since the region in the active layer 102 below the gate electrode 106 is not exposed, one of the problems with conventional GaN-based field effect transistors, which is a so-called current collapse phenomenon, does not occur, whereby a highly reliable field effect transistor is realized.

Furthermore, in the first embodiment, just by forming the gate electrode formation material into a thin film, it is possible to realize the gate electrode 106 whose gate length is 50 nm or less, which has been very difficult to achieve in conventional planar field effect transistors in which a gate electrode, a source electrode and a drain electrode are disposed in the direction parallel to the substrate surface. Therefore, expensive process, such as electron beam lithography, is not necessary, enabling a higher performance field effect transistor to be fabricated at lower cost.

Figure 2:
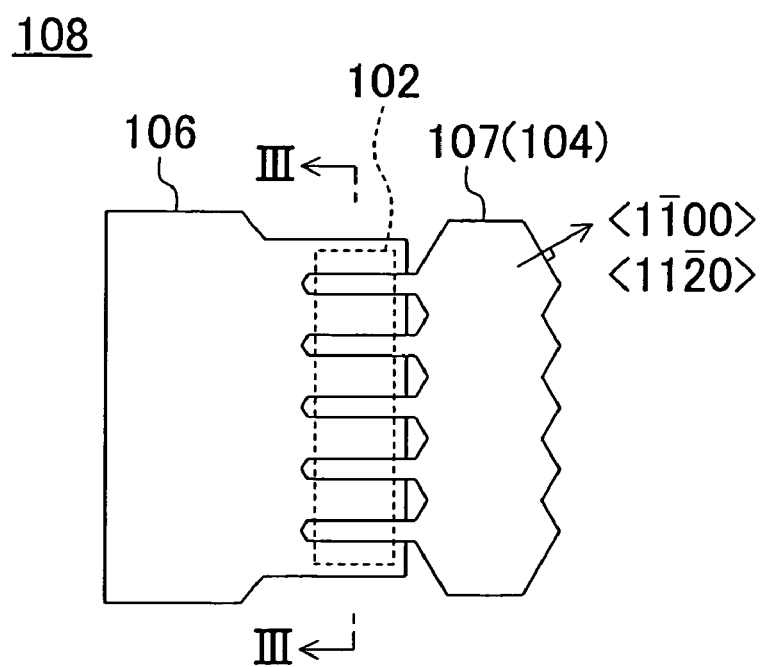
FIG. 2 is a plan view illustrating a field effect transistor according to the first embodiment of the present invention.
Figure 3:
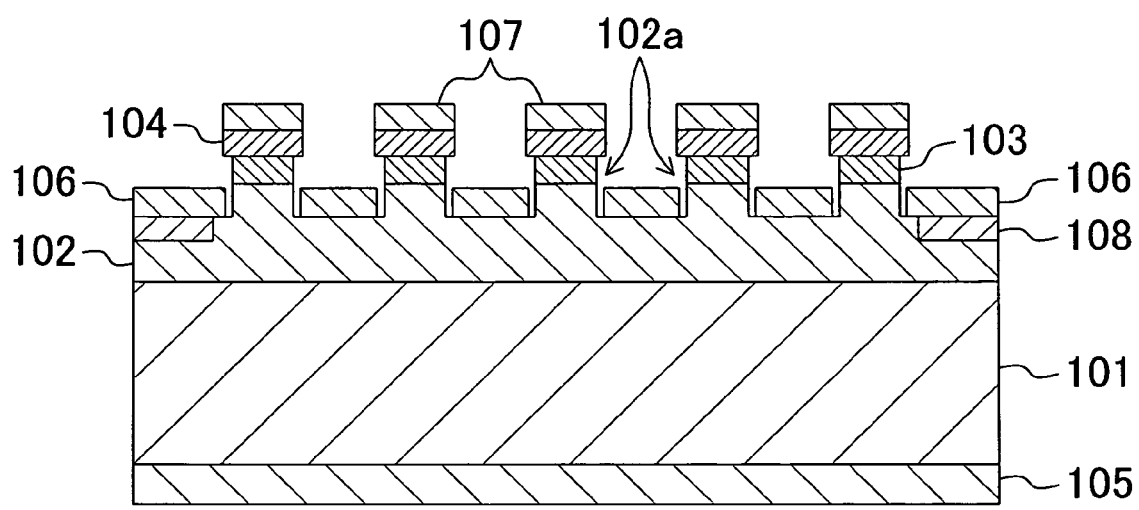
FIG. 3 is a cross-sectional view taken along the line III-III in FIG. 2.

FIG. 2 illustrates the planar structure of a field effect transistor according to the first embodiment. In FIG. 2, the same members as those shown in FIG. 1 are identified by the same reference numerals. With reference to FIG. 2, the field effect transistor, in which a source electrode 104 employs a so-called multifinger structure, instead of the structure shown in FIG. 1, will be described, the source electrode 104 having a plurality of linear portions extending in parallel with each other from a pad portion formed by a combination of hexagons formed by sides in the <1-100> or <11-20> direction of the zone axis of an n-type contact layer. FIG. 3 illustrates the cross-section taken along the line III-III in FIG. 2.

As shown in FIGS. 2 and 3, the n-type contact layer and an active layer 102 are selectively removed in the peripheral portion of a conductive film 107 formed on the source electrode 104 and having substantially the same planar shape as the source electrode 104. In order to eliminate the effect of the anisotropy of etching performed in this removing process, the perimeter of the source electrode 104 has a planar shape formed by a combination of hexagons formed by sides in the <1-100> or <11-20> direction of the zone axis of the n-type contact layer.

Also, a high-resistance region 108 is formed in the active layer 102 except for the adjacent region of the linear (finger) portions of the source electrode 104. That is, the high-resistance region 108 is formed in the region in the active layer 102 located under the gate electrode 106 except for the adjacent region of the linear portions of the source electrode 104, whereby the electric field is reduced under and around the gate electrode 106, thereby allowing high breakdown voltage.

Under the source electrode 104 except for the linear portions thereof, i.e., under the pad portion of the source electrode 104, the n-type contact layer may be partially removed or an insulating film made of silicon dioxide ($SiO_2$) or the like may be provided between the n-type contact layer and the source electrode 104. Then, leakage current between the gate and source electrodes is reduced further.

By structuring the vertical field effect transistor in this way, it is possible to realize a high voltage power transistor capable of operating at higher currents with smaller chip area.

(Fabrication Method)

Hereinafter, with reference to the accompanying drawings, it will be described how to fabricate a field effect transistor according to the first embodiment of the present invention.

FIGS. 4A through 4D are views illustrating process steps for fabricating a vertical-channel field effect transistor according to the first embodiment of the present invention.

Figure 4A:
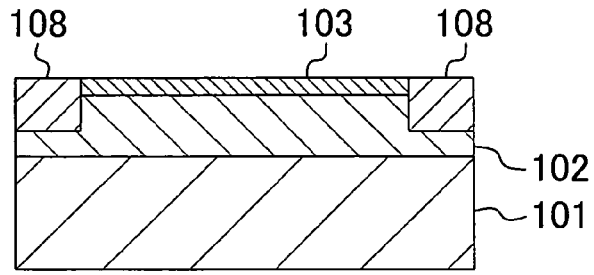
FIGS. 4A to 4D are cross-sectional views for illustrating process steps for fabricating the field effect transistor according to the first embodiment of the present invention.

First, as shown in FIG. 4A, an active layer 102 having a thickness of 2 μm and made of $n^-$-type GaN and an n-type contact layer 103 having a thickness of 20 nm and made of n-type InAlGaN are epitaxially grown in this order on the principal surface of an $n^+$-type GaN substrate 101 whose plane orientation is (0001) by a metal organic chemical vapor deposition (MOCVD) process, for example. Thereafter, a high-resistance region 108 is formed in a region extending from the n-type contact layer 103 to the upper portion of the active layer 102 except for a source electrode formation region, by selective ion implantation of boron (B) ions, oxygen (O) ions, or the like.

Figure 4B:
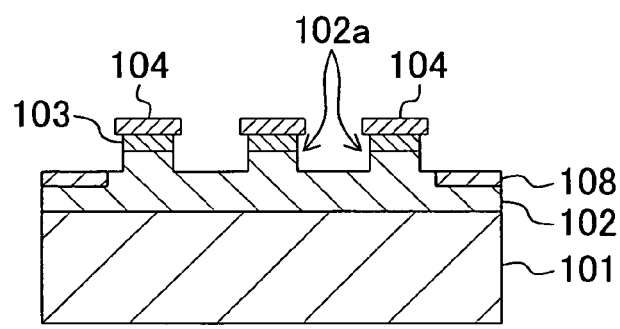

Next, as shown in FIG. 4B, a source electrode formation film made of WSi is deposited on the n-type contact layer 103 by a chemical vapor deposition (CVD) process or a sputtering process. Thereafter, by using a mask pattern corresponding to the source electrode 104 shown in FIG. 3, the deposited source electrode formation film is etched by lithography so that a plurality of linear portions having a width of about 0.8 μm are located inside the high-resistance region 108, whereby a source electrode 104 having a multifinger structure is formed. Subsequently, with the source electrode 104 used as a mask, the n-type contact layer 103, the active layer 102, and the high-resistance region 108 are wet etched to a depth of about 300 nm by using an alkaline solution such as potassium hydroxide (KOH), for example. By this process step, a plurality of projections 102a are formed on the upper portion of the active layer 102. Since this wet etching proceeds relatively isotropically, the n-type contact layer 103 and the active layer 102 are etched in such a manner that for each projection 102a the source electrode 104 has the shape of a canopy.

Figure 4C:
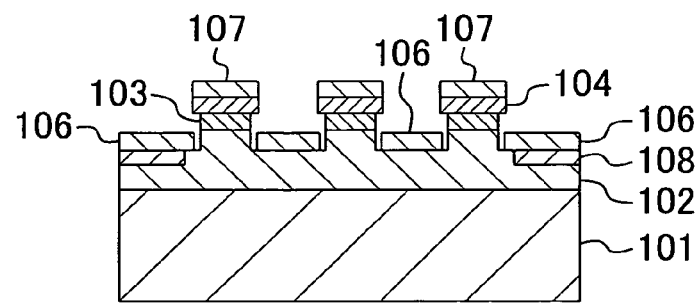

Next, as shown in FIG. 4C, a gate electrode 106, having the planar pattern shown in FIG. 3, having a thickness of about 50 nm, and made of PdSi, is formed in a self-aligned manner on the active layer 102 and the high-resistance region 108 exposed by the etching, by a CVD process or a sputtering process with the source electrode 104 used as a mask. In this process, a conductive film 107 made of PdSi is formed on the source electrode 104.

Figure 4D:
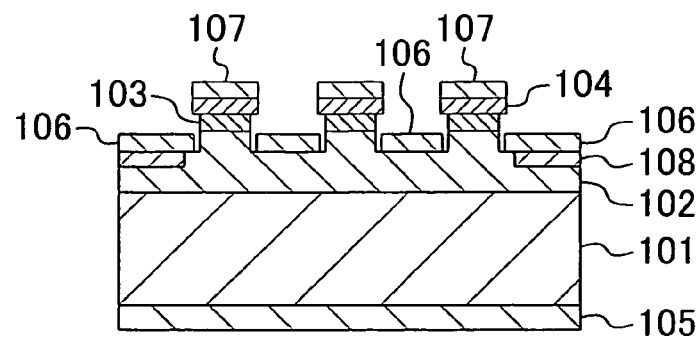

Then, as shown in FIG. 4D, a drain electrode 105 having a multilayer structure of Ti and Al is formed on the surface of the substrate 101 away from the active layer 102 by a sputtering process, for example. The drain electrode 105 may be formed after the thickness of the substrate 101 is reduced to about 150 μm.

As described above, according to the field effect transistor fabrication method of the first embodiment, the gate electrode 106 is formed in a self-aligned manner by using the canopy-shaped source electrode 104 formed over the top surfaces of the projections 102a in the process step shown in FIG. 4C. It is thus possible to easily fabricate the vertical field effect transistor having small chip area.

In addition, the gate length of the gate electrode 106 is not controlled by the size of the mask pattern but determined by the film thickness of the gate electrode 106. Therefore, since it is easy to reduce the film thickness of the gate electrode 106, improvements of characteristics resulting form the reduced gate length are achievable.

Figure 5:
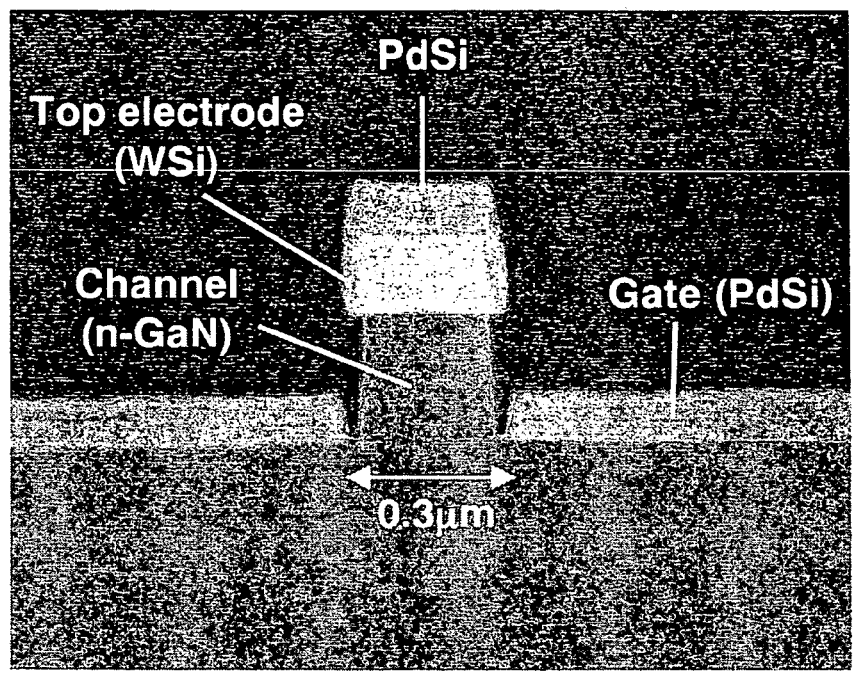
FIG. 5 is a photograph, taken using a scanning electron microscope, which shows a cross-section of the field effect transistor according to the first embodiment of the present invention.

FIG. 5 is a photograph, taken using a scanning electron microscope (SEM), which shows a cross-section of the field effect transistor according to the first embodiment of the present invention. It can be seen from FIG. 5 that the gate electrode is formed in a so-called self-aligned process with the source electrode used as a mask, as described with reference to FIG. 1.

Figure 6:
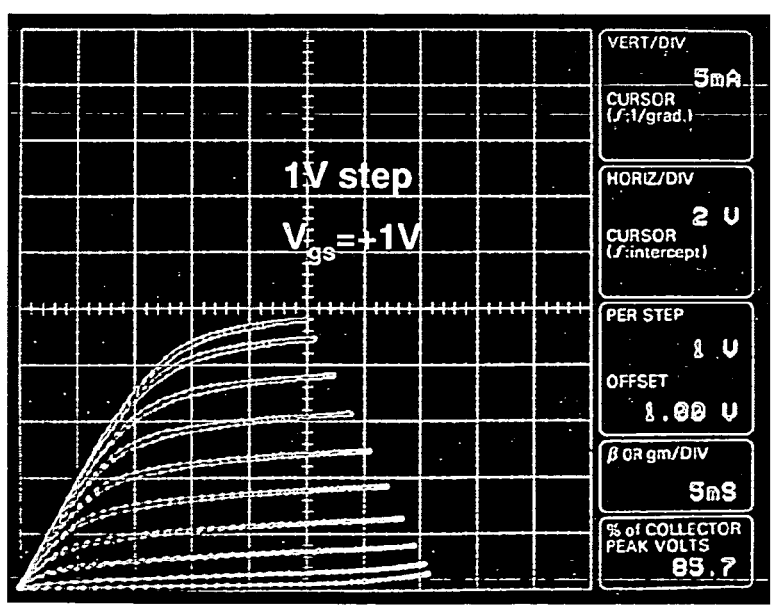
FIG. 6 is a graph showing drain current—drain voltage (Ids-Vds) characteristics in the field effect transistor according to the first embodiment of the present invention.

FIG. 6 shows the results of measurements of drain current—drain voltage (Ids-Vds) characteristics in the field effect transistor according to this embodiment. As can be seen from FIG. 6, when the drain voltage Vds was 10V, the drain current was 240 mA/mm (per unit finger length). This means that a current density of 80 $kA/cm^2$ was obtained, which is a very large value for a GaN-based vertical device. It was also confirmed that by structuring the gate electrode so as to obtain a fine channel whose width is almost 0.3 μm, excellent pinch-off characteristics were achieved.

Figure 7A:
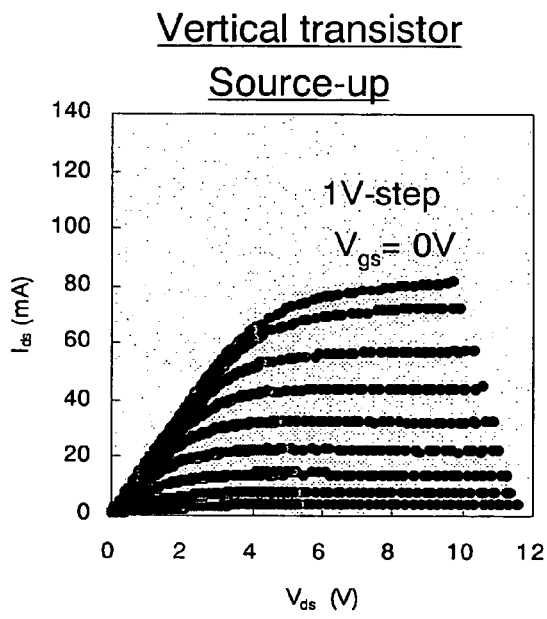
FIGS. 7A and 7B are graphs showing the results of evaluation of a current collapse phenomenon in the field effect transistor according to the first embodiment of the present invention.
Figure 7B:
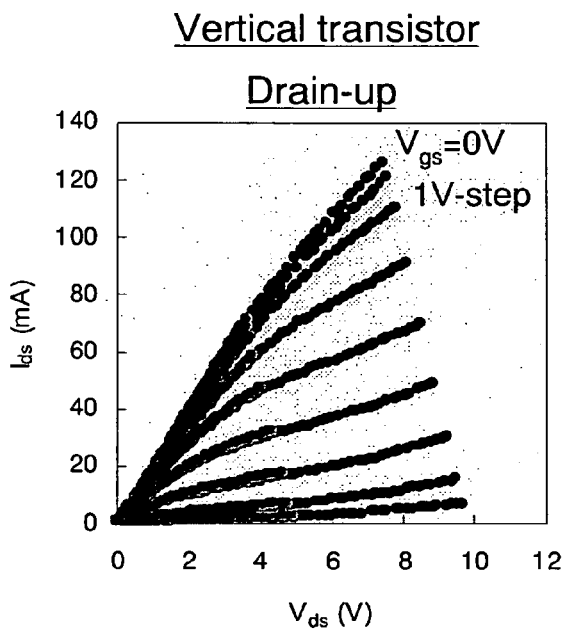

FIGS. 7A and 7B show the results of evaluation of the above-described current collapse phenomenon in the field effect transistor according to this embodiment. The evaluation was made by applying pulse voltage by a curve tracer, with the maximum drain voltage being changed to several different values. FIG. 7A shows a case in which the electrode (the upper electrode) over the top surfaces of the projections 102a was a source electrode, while FIG. 7B shows a case in which the upper electrode was a drain electrode. In both cases, the Ids-Vds characteristics did not change, which indicates that the current collapse phenomenon was suppressed.

Thus, in the first embodiment, it is possible to reliably operate the vertical transistor irrespective of whether the upper electrode is a source electrode or a drain electrode.

Figure 7C:
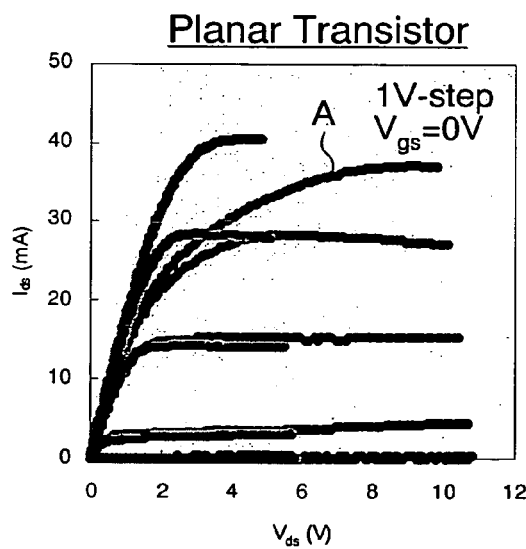
FIG. 7C, provided for the sake of comparison, is a graph showing the results of evaluation of a current collapse phenomenon in a conventional GaN-based planar field effect transistor.

FIG. 7C shows, as a comparative example, the results of evaluation of a current collapse phenomenon in a conventional planar transistor including an AlGaN/GaN heterojunction. As indicated by a curve A in FIG. 7C, when the gate-source voltage Vgs is high, the on resistance is high, thereby causing the occurrence of a current collapse phenomenon, in which the drain current Ids decreases.

As is clear from the results described above, in the case of the planar transistor, since the surface area of semiconductor layer exposed at the surface of the transistor is large, the transistor is likely to be affected by a surface trap. In contrast, in the case of the vertical transistor, since the surface area of exposed semiconductor layer is reduced, the transistor is not likely to be affected by a surface trap, which presumably suppresses the occurrence of a current collapse phenomenon.

As described above, in the first embodiment, high current density, excellent pinch-off characteristics, and suppression of current collapse phenomenon are achieved.

Second Embodiment

Hereinafter, a second embodiment of the present invention will be described with reference to the accompanying drawings.

Figure 8:
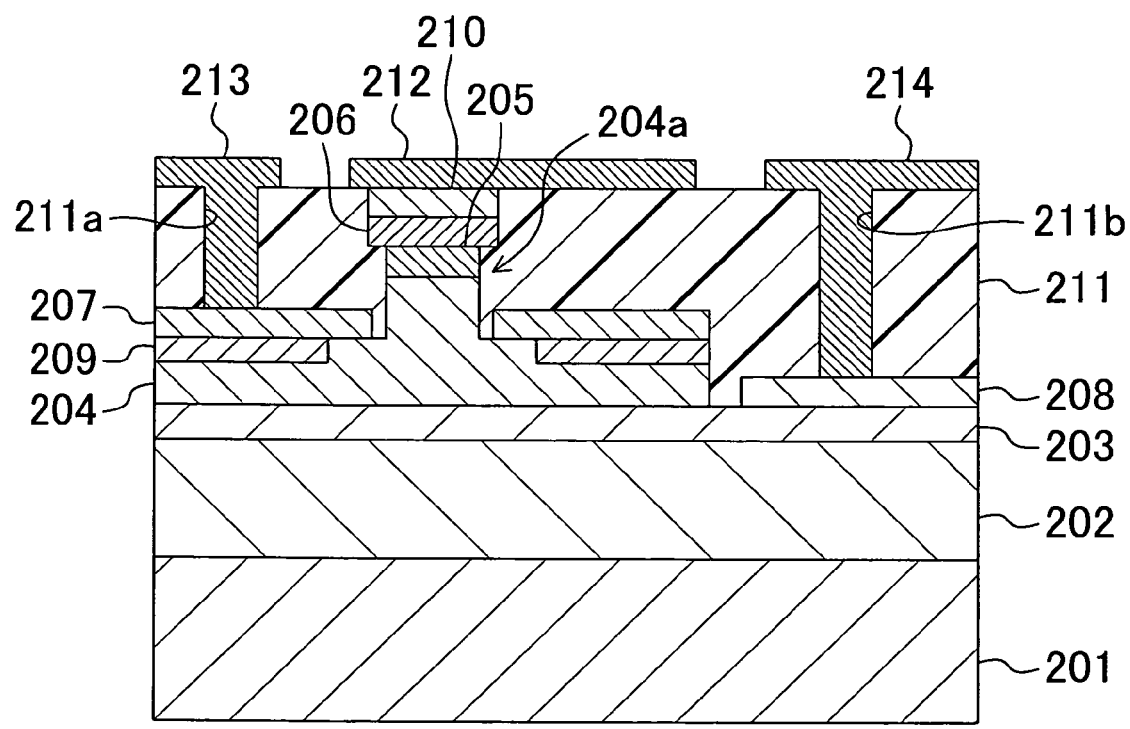
FIG. 8 illustrates a semiconductor device, which is a vertical-channel field effect transistor, according to a second embodiment of the present invention, and is a cross-sectional view taken along the line VIII-VIII in FIG. 9.

FIG. 8 illustrates a cross sectional structure of a semiconductor device, which is a vertical-channel field effect transistor, according to the second embodiment of the present invention.

As shown in FIG. 8, the field effect transistor according to the second embodiment includes an underlying layer 202, a first contact layer 203, an active layer 204, second contact layers 205 (only one of them is shown in FIG. 8), source electrodes 206 (only one of them is shown in FIG. 8), and a gate electrode 207, formed in this order on the principal surface of a sapphire substrate 201, whose plane orientation is (0001), for example. The underlying layer 202 has a thickness of 2 μm and is made of undoped GaN. The first contact layer 203 has a thickness of 1 μm and is made of n$^+$-type GaN. The active layer 204 has a thickness of about 1.7 μm, has projections 204a (only one of them is shown in FIG. 8) on the upper portion thereof, and is made of n$^-$-type GaN. The second contact layers 205 are formed on the top surfaces of the projections 204a of the active layer 204 and are made of n-type InAlGaN having a thickness of 20 nm. The source electrodes 206 are made of WSi and formed on the second contact layers 205 so as to overhang like a canopy. The gate electrode 207 is made of PdSi and formed to the side of the projections 204a of the active layer 204.

In the second embodiment, since the substrate 201 is an insulating substrate, part of the first contact layer 203 near one side of the source electrodes 206 is exposed, and a drain electrode 208 made of Ti/Al is formed on the exposed portion.

As in the first embodiment, a high-resistance region 209 is formed in an upper portion in the active layer 204 located under the gate electrode 207 by ion implantation of, e.g., B ions or O ions, by selective oxidation, or the like. A conductive film 210 made of the PdSi of the gate electrode 207 is formed on each source electrode 206.

An interlayer insulating film 211 made of benzocyclobutene (BCB) is formed around the conductive films 210, source electrodes 206, and projections 204a in such a manner that the conductive films 210 are exposed and the surface thereof is planarized.

On the interlayer insulating film 211, a source interconnect 212, a gate interconnect 213, and a drain interconnect 214 are formed. The source interconnect 212 is made of gold (Au) plating and connected with the conductive films 210. The gate interconnect 213 is made of Au plating and connected with the gate electrode 207 through a first contact hole 211a exposing the gate electrode 207. The drain interconnect 214 is made of Au plating and connected with the drain electrode 208 through a second contact hole 211b exposing the drain electrode 208.

As in the first embodiment, the second contact layers 205 achieve a contact resistance of about $1 \times 10^{-5}$ $\Omega^2$ cm with respect to the source electrodes 206. The InAlGaN of the second contact layers 205, which is quaternary mixed crystal, may be $In_{0.09}Al_{0.39}Ga_{0.52}N$, for example, and may have any composition that allows the second contact layers 205 to have excellent crystallinity and to become thick films for lattice matching with the GaN of the active layer 204. Also, the source electrode 206 on each second contact layer 205 is formed to overhang from the side faces of the projection 204a like a canopy, and the gate electrode 207 is formed by a so-called self-aligned process with the source electrodes 206 used as a mask.

In the second embodiment, if the width of each projection 204a shown in FIG. 8 is 0.6 μm and the carrier concentration of the active layer 204 is $1 \times 10^{17} cm^{-3}$, for example, the threshold voltage of the field effect transistor becomes close to 0 V, allowing realization of so-called normally-off operation.

The interlayer insulating film 211 made of BCB according to the second embodiment may be formed by application, and thus can be easily formed as a thick film. In addition, BCB, having a small dielectric constant value of 2.5, can reduce the parasitic capacitance of the field effect transistor, thereby enabling realization of the field effect transistor having excellent high-frequency characteristics.

It should be noted that the material of the interlayer insulating film 211 is not limited to BCB, but other dielectric material, e.g., polyimide, may be used.

Also, the method for planarizing and exposing the conductive films 210 on the source electrodes 206 after the application is not limited to etchback, but other structure may be employed, in which openings (vias) for exposing the conductive films 210 are formed so that the conductive films 210 are connected with the source interconnect 212.

Figure 9:
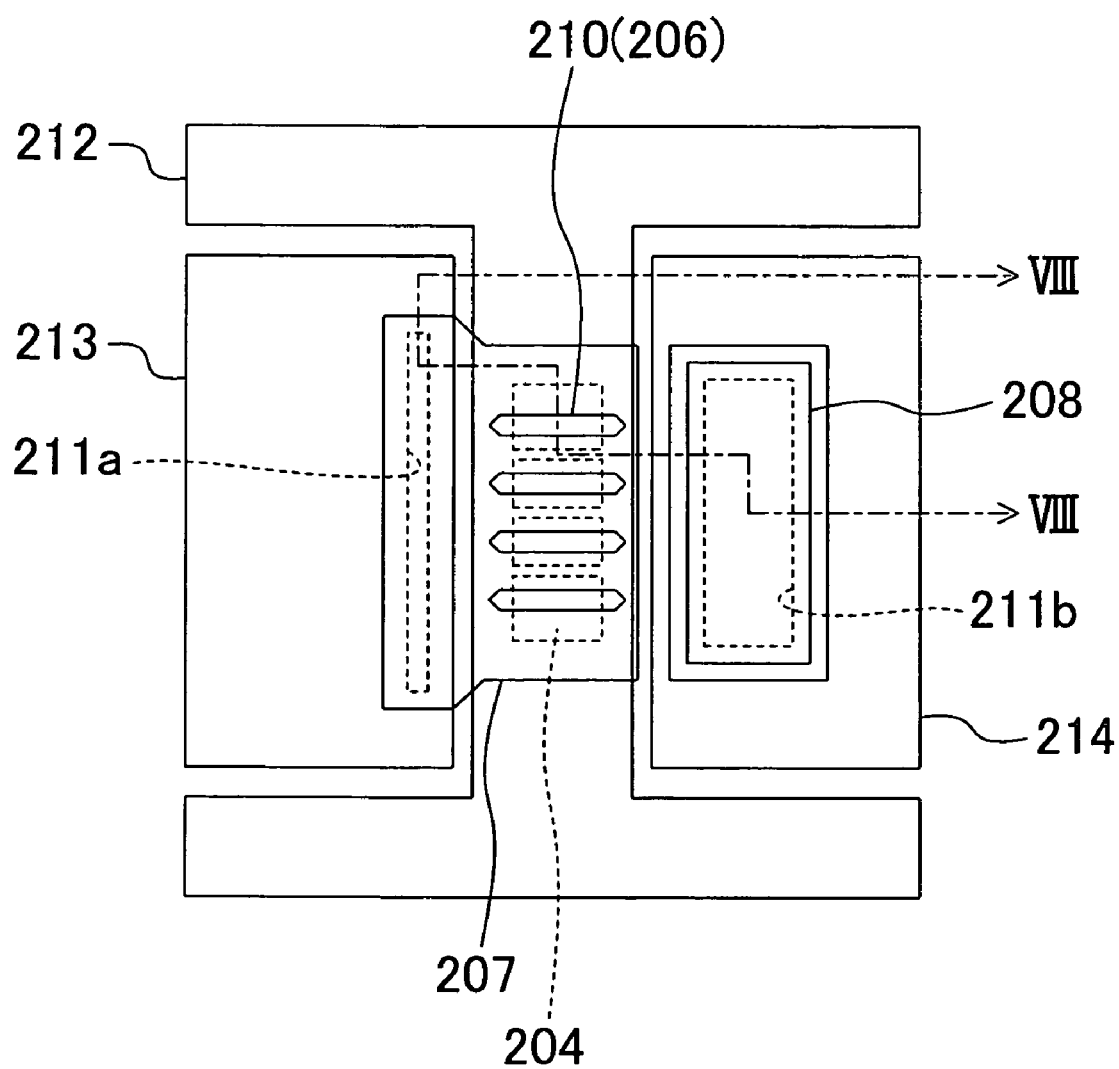
FIG. 9 is a plan view illustrating the field effect transistor according to the second embodiment of the present invention.

FIG. 9 illustrates the planar structure of the field effect transistor according to the second embodiment. In FIG. 9, the same members as those shown in FIG. 8 are identified by the same reference numerals. FIG. 8 is the cross-sectional view taken along the line VIII-VIII in FIG. 9.

As shown in FIG. 9, the source electrodes 206 of the field effect transistor according to the second embodiment have an island-like multifinger structure composed of only isolated linear portions, so as to allow larger current. The source electrodes 206 are connected with the source interconnect 212 through the respective conductive films 210.

In order to eliminate the effect of the anisotropy of etching on the second contact layers and the active layer located under the source electrodes 206, the perimeter of each source electrode 206 has a hexagonal planar shape formed by sides in the <1-100> or <11-20> direction of the zone axis of the second contact layer.

Also, since the high-resistance region 209 is formed in the region in the active layer 204 which is located under the gate electrode 207 around the source electrodes 206, the electric field around the gate electrode 207 is reduced, thereby enabling high breakdown voltage.

As described above, the field effect transistor according to the second embodiment realizes a high voltage device with small chip area by employing the vertical structure. In addition, since the region in the active layer 204 below the gate electrode 207 is not exposed, one of the problems with conventional GaN-based field effect transistors, which is a so-called current collapse phenomenon, does not occur, whereby a highly reliable field effect transistor is realized.

Furthermore, in the second embodiment, since BCB is used in the interlayer insulating film 211, the vertical field effect transistor with excellent high-frequency characteristics is achievable.

(Fabrication Method According to the Second Embodiment)

Hereinafter, with reference to the accompanying drawings, it will be described how to fabricate a vertical-channel field effect transistor having the above-described structure.

FIGS. 10A through 10F are views illustrating process steps for fabricating a vertical-channel field effect transistor according to the second embodiment of the present invention.

Figure 10A:
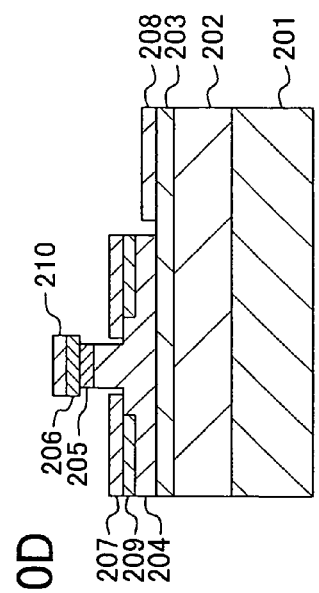
FIGS. 10A to 10F are cross-sectional views for illustrating process steps for fabricating the field effect transistor according to the second embodiment of the present invention.

First, as shown in FIG. 10A, an underlying layer 202, a first contact layer 203, an active layer 204, and a second contact layer 205 are epitaxially grown in this order on the principal surface of a sapphire substrate 201, whose plane orientation is (0001), by a MOCVD process, for example. The underlying layer 202 has a thickness of 2 μm and is made of undoped GaN. The first contact layer 203 has a thickness of 1 μm and is made of n$^+$-type GaN. The active layer 204 has a thickness of 2 μm and is made of n$^-$-type GaN. The second contact layer 205 has a thickness of 20 nm and is made of n-type InAlGaN. Thereafter, a high-resistance region 209 is formed in a region extending from the second contact layer 205 to the upper portion of the active layer 204 except for a source electrode formation region, by selective ion implantation of boron (B) ions, oxygen (O) ions, or the like.

Figure 10B:
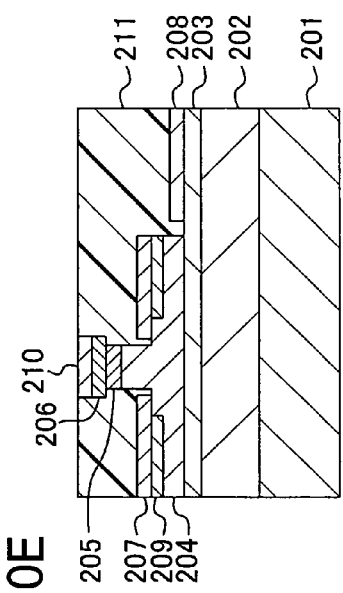

Next, as shown in FIG. 10B, a source electrode formation film made of WSi is deposited on the second contact layer 205 by a CVD process or a sputtering process. Thereafter, by using a mask pattern corresponding to the source electrodes 206 shown in FIG. 9, the deposited source electrode formation film is etched by lithography so that a plurality of linear portions having a width of about 0.8 μm are located inside the high-resistance region 209, whereby source electrodes 206 having a multifinger structure are formed. Subsequently, with the source electrodes 206 used as a mask, the second contact layer 205, the active layer 204, and the high-resistance region 209 are wet etched to a depth of about 300 nm by using an alkaline solution such as KOH, for example. By this process step, a plurality of projections 204a are formed on the upper portion of the active layer 204. As mentioned above, in this wet etching process, the second contact layer 205 and the active layer 204 are etched in such a manner that for each projection 204a the corresponding source electrode 206 has the shape of a canopy. It is desirable that the planar shape of each island-like source electrode 206 be a hexagon formed by sides in the <1-100> or <11-20> direction of the zone axis of the second contact layer 205, because the hexagonal planar shape allows the canopy portion of each source electrode 206 to be formed isotropically. It should be noted that the planar shape of each island-like source electrode 206 may be circular.

Figure 10C:
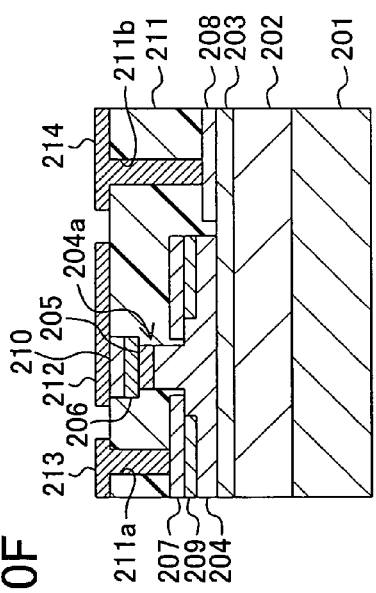

Next, as shown in FIG. 10C, a gate electrode 207, having the planar pattern shown in FIG. 9, having a thickness of about 50 nm, and made of PdSi, is formed in a self-aligned manner on the active layer 204 and high-resistance region 209 exposed by the etching, by a CVD process or a sputtering process with the source electrodes 206 used as a mask. In this process, a conductive film 210 made of PdSi is formed on each source electrode 206.

Figure 10D:
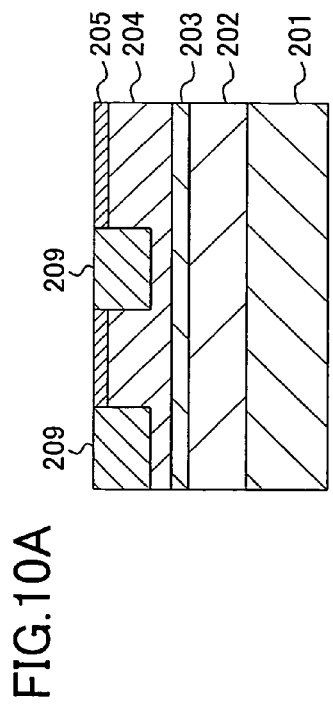

Subsequently, as shown in FIG. 10D, a region in the active layer 204 near the side of the source electrodes 206 in the gate width direction is dry etched by using inductively coupled plasma (ICP), for example, thereby selectively exposing part of the first contact layer 203. Thereafter, a drain electrode 208 made of Ti/Al is formed on the exposed part of the first contact layer 203.

Figure 10E:
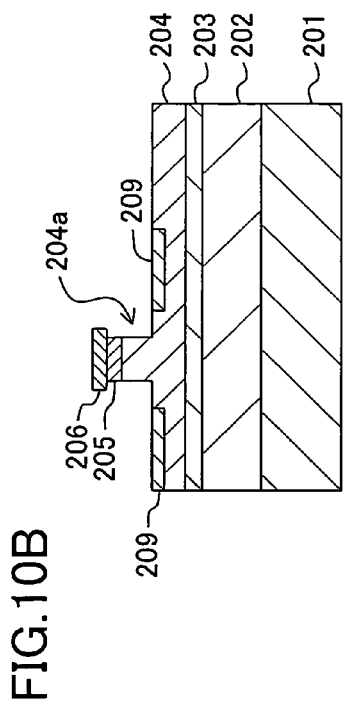

Then, as shown in FIG. 10E, an interlayer insulating film 211 made of BCB is formed by application over the entire surface of the substrate 201. Thereafter, the deposited interlayer insulating film 211 is etched back by reactive ion etching (RIE) or the like, whereby the conductive film 210 on each source electrode 206 is exposed while the upper surface of the interlayer insulating film 211 is planarized.

Figure 10F:
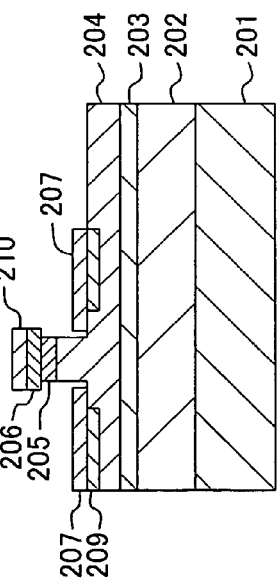

Next, as shown in FIG. 10F, a first contact hole 211a for exposing part of the gate electrode 207 and a second contact hole 211b for exposing part of the drain electrode 208 are selectively formed in the interlayer insulating film 211 by lithography and by RIE. Subsequently, a source interconnect, a gate interconnect 213, and a drain interconnect 214 are formed on the interlayer insulating film 211 by gold plating. The source interconnect is formed so as to be connected with the conductive film 210 on each source electrode 206. The gate interconnect 213 and the drain interconnect 214 are connected with the gate electrode 207 and the drain electrode 208, respectively, through the respective contact holes 211a and 211b.

As described above, according to the field effect transistor fabrication method of the second embodiment, the gate electrode 207 is formed in a self-aligned process by using, as a mask, the canopy-shaped source electrodes 206 formed on the projections 204a of the active layer 204, as in the first embodiment. It is thus possible to form the vertical field effect transistor with small chip area more easily and more reliably.

In addition, the gate length is not controlled and formed by the pattern size but determined by the film thickness of the gate electrode. Therefore, if the film thickness is reduced further, improvements of characteristics resulting from the reduced gate length can be achieved.

Also, the gate length of the gate electrode 207 is not controlled by the size of the mask pattern but determined by the film thickness of the gate electrode 207. Therefore, since it is easy to reduce the film thickness of the gate electrode 207, improvements of characteristics resulting form the reduced gate length are achievable.

Both in the GaN substrate 101 used in the first embodiment and in the sapphire substrate 201 used in the second embodiment, the plane orientation of the principal surface is (0001), but the present invention is not limited to this. Specifically, the principal surface may have a plane orientation having a slight off angle with respect to a typical plane, such as the (0001) plane, for example.

Furthermore, the substrates for the epitaxial growth are not limited to GaN and sapphire, but silicon carbide (SiC), zinc oxide (ZnO), silicon (Si), gallium arsenide (GaAs), gallium phosphide (GaP), indium phosphide (InP), or LiGa$_x$Al$_{1-x}$O$_2$ ($0 \leq x \leq 1$) may be used.

Moreover, in the field effect transistors according to the first and second embodiments, the nitride semiconductors of the epitaxially grown layers, such as the active layers 102 and 204, the n-type contact layer 104, and the second contact layers 205, for example, may have any compositions and those epitaxially grown layers may include any multilayer structures, so long as the desired transistor characteristics are obtained.

Also, the crystal growth method for the epitaxially grown layers is not limited to an MOCVD process, but epitaxial layers formed by molecular beam epitaxy (MBE) or hydride vapor phase epitaxy (HVPE), for example, may be included.

Furthermore, the epitaxially grown layers may contain a group V element, such as arsenide (As) or phosphorus (P), or a group III element, such as boron (B), as a constituent element.

Moreover, in the second embodiment, the source electrodes are also formed over the top surfaces of the respective projections selectively formed on the active layer, with the respective contact layers interposed therebetween, while the drain electrode is formed on the active layer away from the projections. Nevertheless, the drain electrodes may be formed over the top surfaces of the respective projections with the respective contact layers interposed therebetween, and the source electrode may be formed on the active layer away from the projections.

As described above, the vertical-channel semiconductor devices according to the present invention have small chip area and excellent device characteristics, and thus effectively function as high-power high-voltage transistors for use in power supply circuits and the like in consumer appliances, for example.

What is claimed is:

1. A semiconductor device, comprising:
a first nitride semiconductor layer having at least one projection on an upper surface thereof;
a second nitride semiconductor layer formed on a top surface of the projection of the first nitride semiconductor layer and having a higher carrier concentration than the first nitride semiconductor layer;
a first electrode formed on the second nitride semiconductor layer so as to overhang like a canopy and functioning as one of a source and a drain; and
a second electrode formed to the side of the projection on the first nitride semiconductor layer and functioning as a gate.

2. The semiconductor device of claim 1, wherein a conductive film made of the same material as the second electrode is formed on the first electrode.

3. The semiconductor device of claim 1, wherein the second nitride semiconductor layer is made of a quaternary mixed crystal of InAlGaN.

4. The semiconductor device of claim 3, wherein the quaternary mixed crystal has a composition that allows the quaternary mixed crystal to achieve lattice matching with the first nitride semiconductor layer.

5. The semiconductor device of claim 3, wherein an amount of polarization occurring in the quaternary mixed crystal is greater than or equal to an amount of polarization occurring in the first nitride semiconductor layer.

6. The semiconductor device of claim 1, wherein a high-resistance region is formed in part of the first nitride semiconductor layer located under the second electrode.

7. The semiconductor device of claim 6, wherein the high-resistance region is formed in an entire part of the first nitride semiconductor layer located under a peripheral portion of the second electrode.

8. The semiconductor device of claim 1, wherein a high-resistance region is formed in part of the first nitride semiconductor layer below the first electrode.

9. The semiconductor device of claim 1, wherein part of the second nitride semiconductor layer below the first electrode is selectively removed.

10. The semiconductor device of claim 1, further comprising an insulating film formed in a region between the first electrode and the second nitride semiconductor layer.

11. The semiconductor device of claim 1, wherein each side of a perimeter of the first electrode is a line segment in a <1-100> or <11-20> direction of a zone axis of the second nitride semiconductor layer.

12. The semiconductor device of claim 1, wherein part of the first electrode is made of tungsten silicide (WSi).

13. The semiconductor device of claim 1, wherein a region around the first electrode is filled with a resin material made of benzocyclobutene.

14. The semiconductor device of claim 1, wherein surfaces of the first and second nitride semiconductor layers are non-polarized surfaces in which the number of nitrogen atoms and the number of group III metal atoms are equal to each other.

15. The semiconductor device of claim 1, wherein surfaces of the first and second nitride semiconductor layers are nitrogen surfaces containing only nitrogen atoms, and the plane orientation thereof is (000-1).

16. The semiconductor device of claim 1, further comprising a conductive substrate made of gallium nitride and functioning as an underlying layer for the first nitride semiconductor layer; and
a third electrode formed on a surface of the conductive substrate away from the first nitride semiconductor layer and functioning as the other of the source and the drain.

* * * * *